United States Patent
Ma et al.

(10) Patent No.: US 12,248,050 B2
(45) Date of Patent: Mar. 11, 2025

(54) DYNAMIC ERROR MEASUREMENT APPARATUS, SYSTEM, METHOD FOR ELECTRICITY METER

(71) Applicants: Power Supply Service and Management Center, State Grid Jiangxi Electric Power Co., Ltd., Jiangxi (CN); Beijing University of Chemical Technology, Beijing (CN)

(72) Inventors: Jian Ma, Jiangxi (CN); Tao Hu, Jiangxi (CN); Xuewei Wang, Beijing (CN); Kexu Chen, Jiangxi (CN); Di Wu, Anhui (CN); Yan Zhao, Jiangxi (CN); Gaofeng Deng, Jiangxi (CN); Qiang Liu, Jiangxi (CN); Aichao Yang, Jiangxi (CN); Yanlinzi Huang, Jiangxi (CN)

(73) Assignees: Power Supply Service and Management Center, State Grid Jiangxi Electric Power Co., Ltd., Nanchang (CN); Beijing University of Chemical Technology, Beijing (CN)

( * ) Notice: Subject to any disclaimer, the term of this patent is extended or adjusted under 35 U.S.C. 154(b) by 243 days.

(21) Appl. No.: 18/052,580

(22) Filed: Nov. 4, 2022

(65) Prior Publication Data
US 2024/0085510 A1    Mar. 14, 2024

Related U.S. Application Data

(63) Continuation of application No. PCT/CN2022/110229, filed on Aug. 4, 2022.

(30) Foreign Application Priority Data

Mar. 15, 2022 (CN) .......................... 202210263818.7

(51) Int. Cl.
*G01R 35/00* (2006.01)
*G01R 19/10* (2006.01)

(52) U.S. Cl.
CPC ............. *G01R 35/00* (2013.01); *G01R 19/10* (2013.01)

(58) Field of Classification Search
CPC ...................................................... G01R 35/00
See application file for complete search history.

(56) References Cited

U.S. PATENT DOCUMENTS

| | | | | | |
|---|---|---|---|---|---|
| 6,133,720 | A | * | 10/2000 | Elmore | G01R 35/04 324/74 |
| 6,815,942 | B2 | * | 11/2004 | Randall | G01R 35/04 324/74 |

(Continued)

*Primary Examiner* — Jermele M Hollington
*Assistant Examiner* — Taqi R Nasir

(57) ABSTRACT

Disclosed are a dynamic error measurement apparatus, system, and method for an electricity meter. The measurement apparatus includes a test signal generation unit configured to generate a voltage test signal and two-circuit current test signals, output the voltage test signal to a measurement unit, and output the two-circuit current test signals to the measurement unit and a current summation unit; the measurement unit configured to determine two-circuit electric energy values based on the voltage test signal and the two-circuit current test signals, and output the two-circuit electric energy values to a calculation control unit; the current summation unit configured to determine a combined current signal based on the two-circuit current test signals; and the calculation control unit configured to determine a total electric energy value based on the two-circuit electric energy values. The system includes a standard meter and a measurement apparatus.

10 Claims, 7 Drawing Sheets

(56) References Cited

U.S. PATENT DOCUMENTS

2016/0322818 A1* 11/2016 Malengret .............. G06Q 50/06
2019/0190247 A1* 6/2019 Bernard ................. G01R 31/52

* cited by examiner

DYNAMIC ERROR MEASUREMENT APPARATUS, SYSTEM, METHOD FOR ELECTRICITY METER

CROSS REFERENCE TO RELATED APPLICATIONS

The present application is a Continuation Application of PCT Application No. PCT/CN2022/110229 filed on Aug. 4, 2022, which claims the benefit of Chinese Patent Application No. 202210263818.7 filed on Mar. 15, 2022. All the above are hereby incorporated by reference in their entirety.

TECHNICAL FIELD

The present disclosure relates to the technical field of detection of electricity meters, and in particular, to a dynamic error measurement apparatus, system, and method for an electricity meter.

BACKGROUND

To detect a dynamic error of a detected meter, a measurement apparatus needs to output an alternating current (AC) signal with a changing amplitude, and then measure a measurement error of the detected meter under the changing current signal (or power signal). To accurately measure the dynamic error of the detected meter, the measurement apparatus is generally required to have dynamic accuracy two classes higher than that of the detected meter. In order to obtain the dynamic error of the measurement apparatus, it is usually necessary to carry out a dynamic traceability test on the measurement apparatus. Generally, a standard meter with dynamic accuracy two classes higher than that of the measurement apparatus is used. Based on a dynamic test signal output by the measurement apparatus, the standard meter and the measurement apparatus measure electric energy at the same time, and then the dynamic error of the measurement apparatus is obtained by comparing a difference between the electric energy measured by the standard meter and the measurement apparatus. It can be seen that a standard meter with high dynamic accuracy is mandatory if the dynamic traceability test is carried out on the measurement apparatus according to the conventional method. However, basic error indexes of an existing standard meter are all steady-state indexes obtained through testing by an electricity meter verification apparatus based on a steady-state sinusoidal signal, and do not include a dynamic index. Therefore, there is no usable standard meter with high dynamic accuracy now.

SUMMARY

Embodiments of the present disclosure provide a dynamic error measurement apparatus, system, and method for an electricity meter, so as to overcome or partially overcome the above technical problems.

The embodiments of the present disclosure adopt the following technical solutions:

According to a first aspect, a dynamic error measurement apparatus for an electricity meter is provided, including a test signal generation unit, a measurement unit, a current summation unit, and a calculation control unit, where the test signal generation unit is configured to generate a voltage test signal and two-circuit current test signals under the control of the calculation control unit, output the voltage test signal to the measurement unit, and output the two-circuit current test signals to the current summation unit and the measurement unit;

the measurement unit is configured to determine two-circuit electric energy values based on the received voltage test signal and the received secondary circuit current test signals, and output the two-circuit electric energy values to the calculation control unit;

the current summation unit is configured to determine a combined current signal based on the two-circuit current test signals; and the calculation control unit is configured to determine a total electric energy value based on the two-circuit electric energy values.

Optionally, the test signal generation unit is configured to generate a single-phase voltage test signal and two-circuit single-phase current test signals under the control of the calculation control unit, output the single-phase voltage test signal to the measurement unit, and output the two-circuit single-phase current test signals to the current summation unit and the measurement unit;

the measurement unit is configured to determine two-circuit single-phase electric energy values based on the received single-phase voltage test signal and the received two-circuit single-phase current test signals, and output the two-circuit single-phase electric energy values to the calculation control unit;

the current summation unit is configured to determine a single-phase combined current signal based on the two-circuit single-phase current test signals; and the calculation control unit is configured to determine a total single-phase electric energy value based on the two-circuit single-phase electric energy values.

Optionally, the test signal generation unit is configured to generate a three-phase voltage test signal and two-circuit three-phase current test signals under the control of the calculation control unit, output the three-phase voltage test signal to the measurement unit, and output the two-circuit three-phase current test signals to the current summation unit and the measurement unit;

the measurement unit is configured to determine two-circuit three-phase electric energy values based on the received three-phase voltage test signal and the received two-circuit three-phase current test signals, and output the two-circuit three-phase electric energy values to the calculation control unit;

the current summation unit is configured to determine a three-phase combined current signal based on the two-circuit three-phase current test signals; and the calculation control unit is configured to determine a total three-phase electric energy value based on the two-circuit three-phase electric energy values.

Optionally, the two-circuit current test signals include a first-circuit current test signal and a second-circuit current test signal; the two-circuit electric energy values include a first-circuit electric energy value and a second-circuit electric energy value; and the measurement unit is configured to determine the first-circuit electric energy value based on the voltage test signal and the first-circuit current test signal, determine the second-circuit electric energy value based on the voltage test signal and the second-circuit current test signal, and output the first-circuit electric energy value and the second-circuit electric energy value to the calculation control unit; and the calculation control unit is configured to determine the total electric energy value based on a sum of the first-circuit electric energy value and the second-circuit electric energy value.

According to a second aspect, a dynamic error calibration system for a dynamic error measurement apparatus for an electricity meter is provided, including a standard meter and the above-mentioned dynamic error measurement apparatus for an electricity meter, where the standard meter is configured to receive a voltage test signal and a combined current signal that are output by the dynamic error measurement apparatus for an electricity meter, and determine a standard electric energy value based on the voltage test signal and the combined current signal, where steady-state accuracy of the standard meter is higher than dynamic accuracy of the dynamic error measurement apparatus for an electricity meter; and the calculation control unit or an error arithmetic unit of the standard meter is further configured to calibrate a dynamic error of the dynamic error measurement apparatus for an electricity meter based on the standard electric energy value and a total electric energy value.

According to a third aspect, a dynamic error calibration method for a dynamic error measurement apparatus for an electricity meter is provided, which is implemented by the above-mentioned dynamic error calibration system for a dynamic error measurement apparatus for an electricity meter, where the method includes:

generating, by the test signal generation unit, a voltage test signal and two-circuit current test signals under the control of the calculation control unit;

outputting, by the test signal generation unit, the voltage test signal and the two-circuit current test signals to the measurement unit, such that the measurement unit determines two-circuit electric energy values based on the voltage test signal and the two-circuit current test signals;

outputting, by the test signal generation unit, the two-circuit current test signals to the current summation unit, such that the current summation unit determines a combined current signal based on the two-circuit current test signals;

outputting, by the measurement unit, the two-circuit electric energy values to the calculation control unit, such that the calculation control unit determines a total electric energy value based on the two-circuit electric energy values;

outputting, by the test signal generation unit, the voltage test signal to the standard meter, and outputting, by the current summation unit, the combined current signal to the standard meter, such that the standard meter determines a standard electric energy value based on the voltage test signal and the combined current signal; and calibrating, by the calculation control unit or the error arithmetic unit of the standard meter, a dynamic error of the dynamic error measurement apparatus for an electricity meter based on the total electric energy value and the standard electric energy value.

Optionally, a first-circuit current test signal and a second-circuit current test signal in the secondary circuit current test signals form a mirror change pair, the mirror change pair takes a power-frequency steady-state signal as a reference signal, waveforms of the two-circuit current test signals are constantly changing relative to the reference signal, and a ratio of a sum of instantaneous values of the first-circuit current test signal and the second-circuit current test signal at any time to an instantaneous value of the reference signal at that time does not change.

According to a fourth aspect, a dynamic error measurement system for an electricity meter is provided, including a detected meter and the above-mentioned dynamic error measurement apparatus for an electricity meter, where the detected meter is configured to receive a voltage test signal and a combined current signal that are output by the dynamic error measurement apparatus for an electricity meter, and determine a to-be-detected electric energy value based on the voltage test signal and the combined current signal; and the calculation control unit is further configured to determine a dynamic error of the detected meter based on the to-be-detected electric energy value and a total electric energy value.

According to a fifth aspect, a method for testing a dynamic error of a detected meter based on a dynamic error measurement apparatus for an electricity meter is provided, which is implemented by the above-mentioned dynamic error measurement system for an electricity meter, where the method includes:

generating, by the test signal generation unit, a voltage test signal and two-circuit current test signals under the control of the calculation control unit;

outputting, by the test signal generation unit, the voltage test signal and the two-circuit current test signals to the measurement unit, such that the measurement unit determines two-circuit electric energy values based on the voltage test signal and the two-circuit current test signals;

outputting, by the test signal generation unit, the two-circuit current test signals to the current summation unit, such that the current summation unit determines a combined current signal based on the two-circuit current test signals;

outputting, by the test signal generation unit, the two-circuit electric energy values to the calculation control unit, such that the calculation control unit determines a total electric energy value based on the two-circuit electric energy values;

outputting, by the test signal generation unit, the voltage test signal to the detected meter, and outputting, by the current summation unit, the combined current signal to the detected meter, such that the detected meter determines a to-be-detected electric energy value based on the voltage test signal and the combined current signal; and determining, by the calculation control unit, a dynamic error of the detected meter based on the total electric energy value and the to-be-detected electric energy value.

Optionally, a first-circuit current test signal and a second-circuit current test signal in the two-circuit current test signals form an in-phase change pair and are both power frequency signals, valid values of power frequencies of the first-circuit current test signal and the second-circuit current test signal are constantly changing with time, and waveforms are always consistent.

At least one of the foregoing technical solutions adopted in the embodiments of the present disclosure can achieve the following beneficial effects:

The present disclosure provides a dynamic error measurement apparatus, system, and method for an electricity meter. Firstly, when the measurement apparatus and system are used to calibrate a dynamic error of a measurement apparatus, a conventional electricity meter that only guarantees a steady-state index can be used as a standard meter, which resolves the current problem of lacking a standard meter with high dynamic accuracy. Secondly, when the dynamic error of the measurement apparatus is calibrated, a standard electric energy value measured by the standard meter and a total electric energy value determined by the measurement apparatus are theoretically equal in any time period, such that it theoretically takes the shortest time to calibrate the dynamic error. Finally, a hardware configuration and a wiring mode for testing a dynamic error of a detected meter are the same as those for calibrating the dynamic error of the measurement apparatus, which can greatly reduce uncertainty factors affecting a test result.

BRIEF DESCRIPTION OF THE DRAWINGS

The accompanying drawings described herein are provided for further understanding of the present disclosure, and constitute a part of the present disclosure. The exemplary embodiments of the present disclosure and illustrations thereof are intended to explain the present disclosure, but do not constitute inappropriate limitations to the present disclosure. In the accompanying drawings.

DETAILED DESCRIPTION

Figure 1:
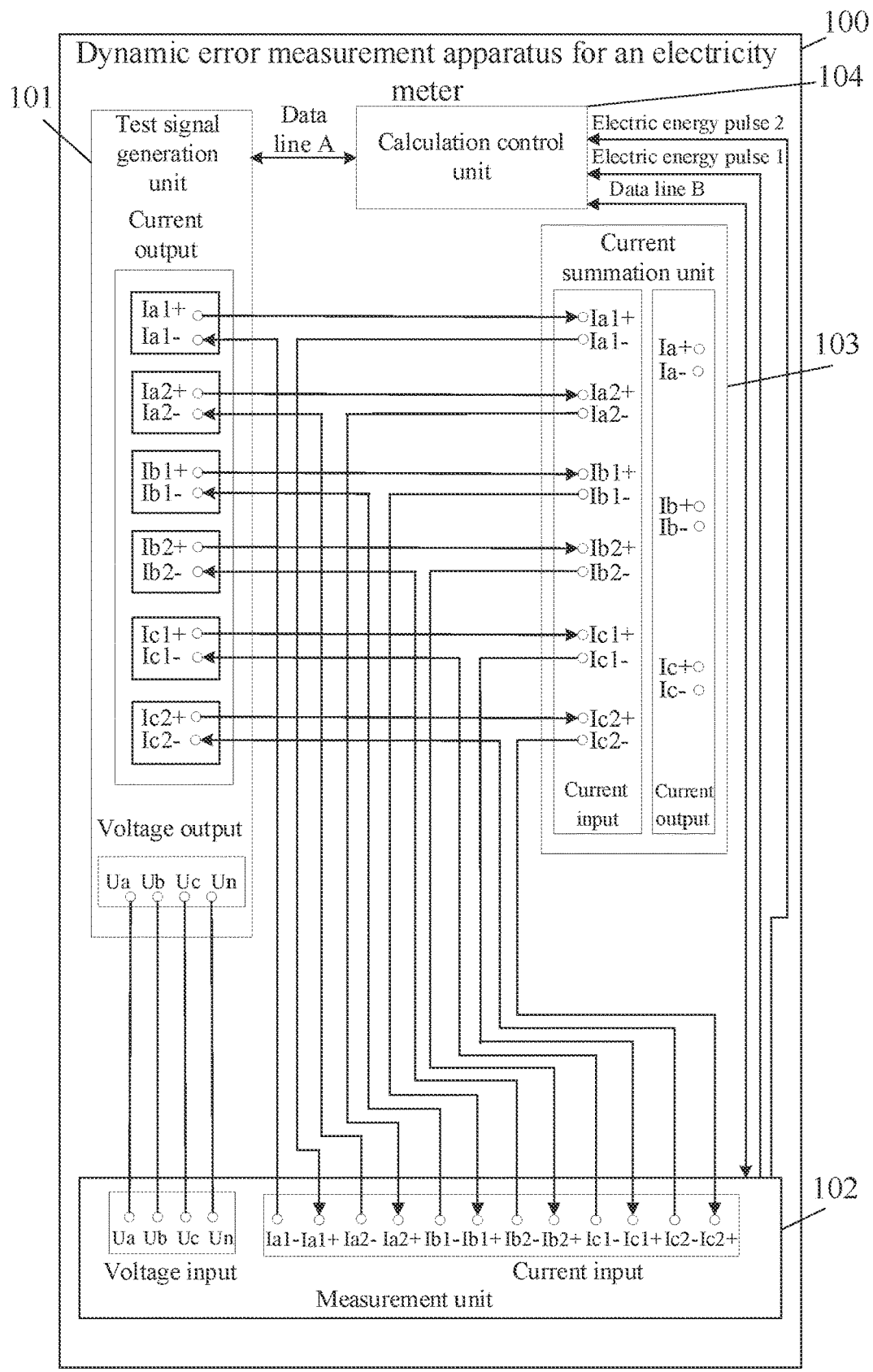
FIG. 1 is a schematic structural diagram of a dynamic error measurement apparatus for an electricity meter according to an embodiment of the present disclosure.

To make the objective, technical solutions and advantages of the present disclosure clearer, the technical solutions in the present disclosure are clearly and completely described below with reference to specific embodiments and corresponding accompanying drawings of the present disclosure. Apparently, the described embodiments are some rather than all of the embodiments of the present disclosure. All other embodiments obtained by those of ordinary skill in the art based on the embodiments of the present disclosure without creative efforts should fall within the protection scope of the present disclosure.

The technical solutions provided in the embodiments of the present disclosure are described in detail below with reference to the accompanying drawings.

The concept of the present disclosure is to provide a dynamic error measurement apparatus, system, and method for an electricity meter. When a dynamic error of the dynamic error measurement apparatus for an electricity meter is calibrated, a conventional electricity meter that only guarantees a steady-state index can be used as a standard meter. When a dynamic error of a detected meter is tested by the dynamic error measurement apparatus for an electricity meter, a hardware configuration and a wiring mode are the same as those for calibrating the dynamic error of the measurement apparatus. This resolves the current problem of lacking a standard meter with high dynamic accuracy when the dynamic error of the measurement apparatus is calibrated, reduces uncertainty factors affecting a test result, and achieves shorter calibration time of the dynamic error.

A dynamic error measurement apparatus 100 for an electricity meter according to an embodiment of the present disclosure includes a test signal generation unit 101, a measurement unit 102, a current summation unit 103, and a calculation control unit 104. The test signal generation unit 101 is configured to generate a voltage test signal and two-circuit current test signals under the control of the calculation control unit 104, output the voltage test signal to the measurement unit 102, and output the two-circuit current test signals to the current summation unit 103 and the measurement unit 102. The measurement unit 102 is configured to determine two-circuit electric energy values based on the received voltage test signal and the received two-circuit current test signals, and output the two-circuit electric energy values to the calculation control unit 104. The current summation unit 103 is configured to determine a combined current signal based on the two-circuit current test signals. The calculation control unit 104 is configured to determine a total electric energy value based on the two-circuit electric energy values.

The calculation control unit 104 plays the following roles in the dynamic error measurement apparatus 100 for an electricity meter: Firstly, the calculation control unit 104 can realize human-computer interaction, that is, a user sends an instruction to the calculation control unit 104, such that the calculation control unit 104 controls the test signal generation unit 101 to generate and output the voltage test signal and the two-circuit current test signals. Secondly, the calculation control unit 104 can realize data transmission, including receiving, in the form of an electric energy pulse, the two-circuit electric energy values output by the measurement unit 102. Thirdly, the calculation control unit 104 can realize data calculation, including determining the total electric energy value based on the two-circuit electric energy values.

The dynamic error measurement apparatus 100 for an electricity meter may be a single-phase measurement apparatus. The test signal generation unit 101 is configured to generate a single-phase voltage test signal and two-circuit single-phase current test signals under the control of the calculation control unit 104, output the single-phase voltage test signal to the measurement unit 102, and output the two-circuit single-phase current test signals to the current summation unit 103 and the measurement unit 102; the measurement unit 102 determines two-circuit single-phase electric energy values based on the received single-phase voltage test signal and the received two-circuit single-phase current test signals, and output the two-circuit single-phase electric energy values to the calculation control unit 104; the current summation unit 103 determines a single-phase combined current signal based on the two-circuit single-phase current test signals; and the calculation control unit 104 determines a total single-phase electric energy value based on the two-circuit single-phase electric energy values.

The dynamic error measurement apparatus 100 for an electricity meter may alternatively be a three-phase measurement apparatus. The test signal generation unit 101 is configured to generate a three-phase voltage test signal and two-circuit three-phase current test signals under the control of the calculation control unit 104, output the three-phase voltage test signal to the measurement unit 102, and output the two-circuit three-phase current test signals to the current summation unit 103 and the measurement unit 102; the measurement unit 102 determines two-circuit three-phase electric energy values based on the received three-phase voltage test signal and the received two-circuit three-phase current test signals, and output the two-circuit three-phase electric energy values to the calculation control unit 104; the current summation unit 103 determines a three-phase combined current signal based on the two-circuit three-phase current test signals; and the calculation control unit 104 determines a total three-phase electric energy value based on the two-circuit three-phase electric energy values.

As an optional implementation, regardless of whether the dynamic error measurement apparatus 100 for an electricity meter is the single-phase measurement apparatus or the three-phase measurement apparatus, the measurement unit 102 determines a first-circuit electric energy value based on the voltage test signal and a first-circuit current test signal, determines a second-circuit electric energy value based on the voltage test signal and a second-circuit current test signal, and outputs the first-circuit electric energy value and the second-circuit electric energy value to the calculation control unit 104, such that the calculation control unit 104 determines the total electric energy value based on a sum of the first-circuit electric energy value and the second-circuit electric energy value.

The voltage test signal may be the single-phase voltage test signal or the three-phase voltage test signal. The two-circuit current test signals may be the two-circuit single-phase current test signals or the two-circuit three-phase current test signals, and specifically include the first-circuit current test signal and the second-circuit current test signal. The two-circuit electric energy values may be the two-circuit single-phase electric energy values or the two-circuit three-phase electric energy values, and specifically include the first-circuit electric energy value and the second-circuit electric energy value. Correspondingly, the total electric energy value may be the total single-phase electric energy value or the total three-phase electric energy value.

Figure 2:
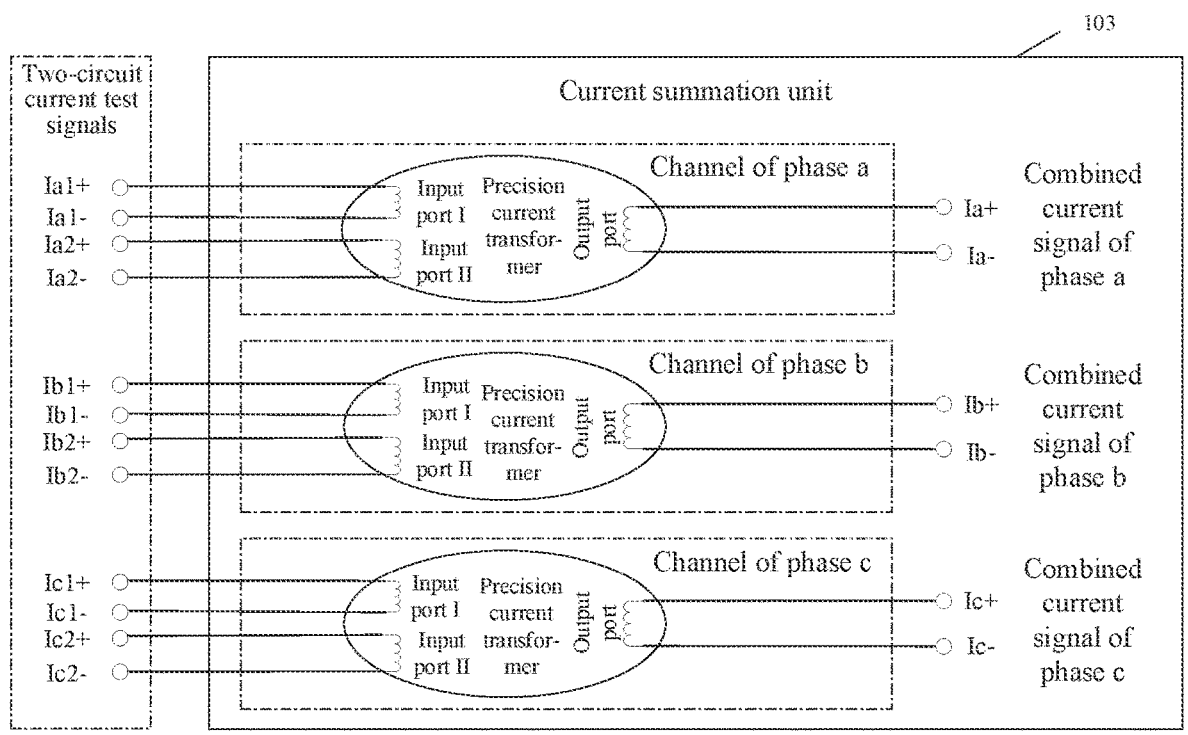
FIG. 2 is a schematic structural diagram of a current summation unit of a dynamic error measurement apparatus for an electricity meter according to an embodiment of the present disclosure.

FIG. 1 shows a dynamic error measurement apparatus for an electricity meter according to an embodiment of the present disclosure. FIG. 2 is a schematic structural diagram of a current summation unit of the dynamic error measurement apparatus for an electricity meter according to an embodiment of the present disclosure. Referring to FIG. 1 and FIG. 2, the dynamic error measurement apparatus 100 for an electricity meter is used as an example below for detailed description.

As shown in FIG. 1, the test signal generation unit 101 is connected to the calculation control unit 104 by data line A, and generates and outputs a three-phase voltage test signal and two-circuit three-phase current test signals under the control of the calculation control unit 104. Four terminals Ua, Ub, Uc, and Un of a voltage output interface of the test signal generation unit 101 output voltage test signals of phase a, phase b, phase c, and a neutral point, respectively. For a current output interface, terminals Ia1$^+$ and Ia1$^-$ are configured to output a first-circuit current test signal of phase a, terminals Ia2$^+$ and Ia2$^-$ are configured to output a second-circuit current test signal of phase a, terminals Ib1$^+$ and Ib1$^-$ are configured to output a first-circuit current test signal of phase b, terminals Ib2$^+$ and Ib2$^-$ are configured to output a second-circuit current test signal of phase b, terminals Ic1$^+$ and Ic1$^-$ are configured to output a first-circuit current test signal of phase c, and terminals Ic2$^+$ and Ic2$^-$ are configured to output a second-circuit current test signal of phase c.

The output three-phase voltage test signal is connected in parallel to a corresponding terminal of a voltage input interface of the measurement unit 102. The output two-circuit three-phase current test signals are connected in series to a corresponding terminal of a current input interface of the current summation unit 103 and a corresponding terminal of a current input interface of the measurement unit 102.

As shown in FIG. 2, the current summation unit 103 is connected to the two-circuit three-phase current test signals, and performs in-phase summation on each phase of the two-circuit current test signals to obtain a three-phase combined current signal. The first-circuit current test signal of phase a that is received by terminals Ia1$^+$ and Ia1$^-$ of the current input interface of the current summation unit 103 and the second-circuit current test signal of phase a that is received by terminals Ia2$^+$ and Ia2$^-$ are combined by a precision current transformer to obtain a combined current signal of phase a that is to be output by terminals Ia$^+$ and Ia$^-$. The first-circuit current test signal of phase b that is received by terminals Ib1$^+$ and Ib1$^-$ of the current input interface of the current summation unit 103 and the second-circuit current test signal of phase b that is received by terminals Ib2$^+$ and Ib2$^-$ are combined by the precision current transformer to obtain a combined current signal of phase b that is to be output by terminals Ib$^+$ and Ib$^-$. The first-circuit current test signal of phase c that is received by terminals Ic1$^+$ and Ic1$^-$ of the current input interface of the current summation unit 103 and the second-circuit current test signal of phase c that is received by terminals Ic2$^+$ and Ic2$^-$ are combined by the precision current transformer to obtain a combined current signal of phase c that is to be output by terminals Ic$^+$ and Ic$^-$.

The measurement unit 102 is connected to the calculation control unit 104 by data line B. The measurement unit 102 measures a first-circuit electric energy value based on the voltage test signal and the first-circuit current test signal (for example, including the above first-circuit current test signals of phase a, phase b, and phase c), and outputs the first-circuit electric energy value to the calculation control unit 104 by data line B or by a signal line of electric energy pulse 1 in the form of an electric energy pulse; and measures a second-circuit electric energy value based on the voltage test signal and the second-circuit current test signal (for example, including the above second-circuit current test signals of phase a, phase b, and phase c), and outputs the second-circuit electric energy value to the calculation control unit 104 by data line B or by a signal line of electric energy pulse 2 in the form of an electric energy pulse.

The calculation control unit 104 receives the first-circuit electric energy value by data line B or by the signal line of electric energy pulse 1, and the second-circuit electric energy value by data line B or by the signal line of electric energy pulse 2, and adds up the first-circuit electric energy value and the second-circuit electric energy value to obtain a total electric energy value (for example, a total three-phase electric energy value).

In this embodiment of the present disclosure, the test signal generation unit 101, the measurement unit 102, the current summation unit 103, and the calculation control unit 104 each may be one or more processors, controllers or chips that each have a communication interface, can realize a communication protocol, and may further include a memory, a related interface and system transmission bus, and the like if necessary. The processor, controller or chip executes program-related code to realize a corresponding function. In an alternative solution, the test signal generation unit 101, the measurement unit 102, the current summation unit 103, and the calculation control unit 104 share an integrated chip or share devices such as a processor, a controller and a memory. The shared processor, controller or chip executes program-related code to implement a corresponding function.

Figure 3:
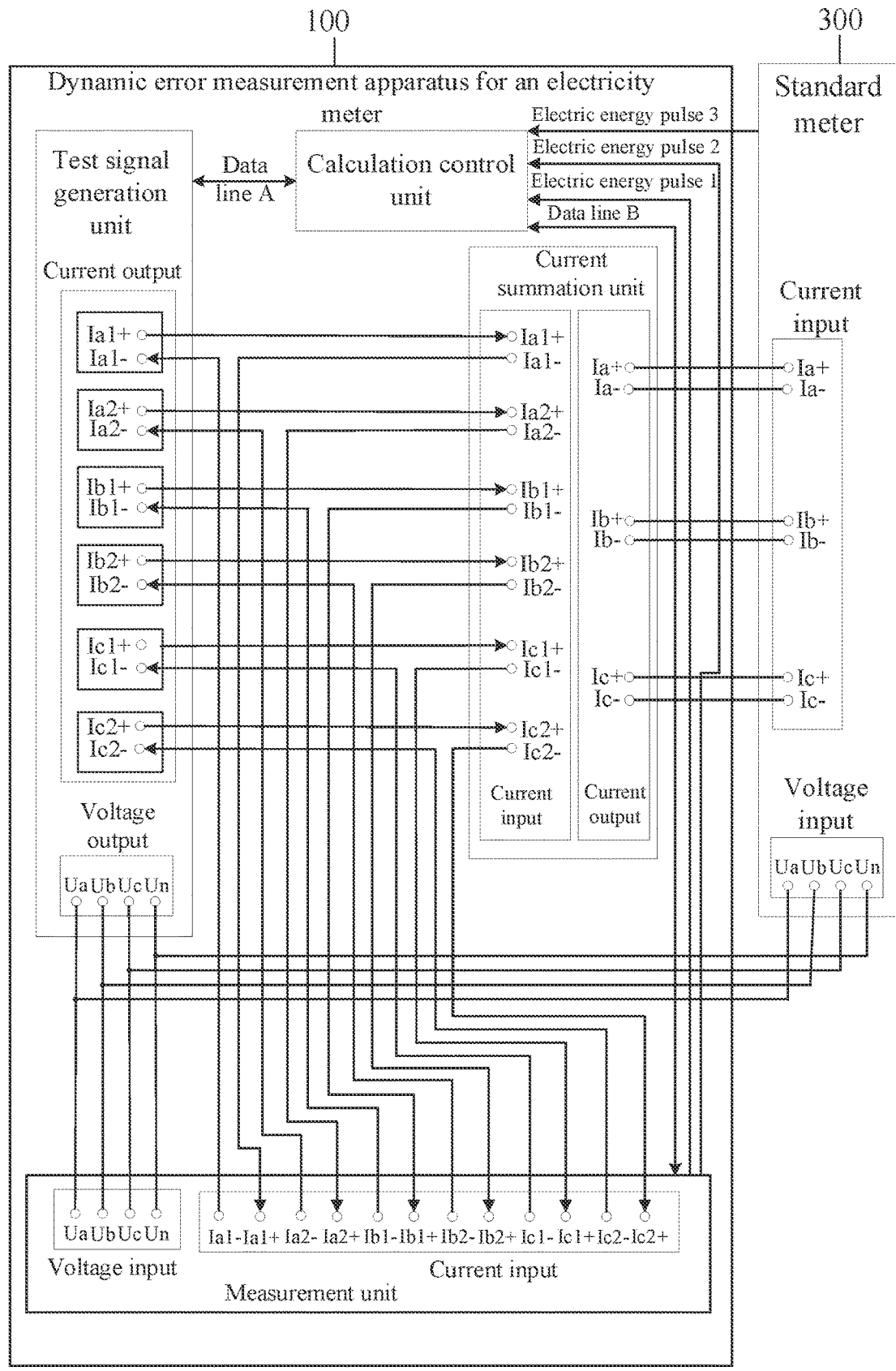
FIG. 3 is a schematic structural diagram of a dynamic error calibration system for a dynamic error measurement apparatus for an electricity meter according to an embodiment of the present disclosure.

FIG. 3 shows a dynamic error calibration system for a dynamic error measurement apparatus for an electricity meter according to an embodiment of the present disclosure. The system can be configured to implement a dynamic error calibration method for a dynamic error measurement apparatus for an electricity meter, and includes a standard meter 300 and the above-mentioned dynamic error measurement apparatus 100 for an electricity meter. The standard meter 300 is configured to receive a voltage test signal and a combined current signal that are output by the dynamic error measurement apparatus 100 for an electricity meter, and determine a standard electric energy value based on the voltage test signal and the combined current signal, where steady-state accuracy of the standard meter 300 is higher than dynamic accuracy of the dynamic error measurement apparatus 100 for an electricity meter. The calculation control unit 104 of the dynamic error measurement apparatus 100 for an electricity meter is further configured to calibrate a dynamic error of the dynamic error measurement apparatus 100 for an electricity meter based on the standard electric energy value and a total electric energy value.

In this system, the voltage test signal generated by the test signal generation unit 101 is output to a corresponding terminal of a voltage input interface of the standard meter 300 in addition to the measurement unit 102. A current test signal output by the current summation unit 103 is output to a corresponding terminal of a current input interface of the standard meter 300.

When the dynamic error measurement apparatus 100 for an electricity meter is a three-phase measurement apparatus, four terminals Ua, Ub, Uc, and Un of a voltage output interface of the test signal generation unit 101 output voltage test signals of phase a, phase b, phase c, and a neutral point respectively, and the voltage test signals are connected to corresponding terminals of the voltage input interface of the standard meter 300 in parallel. The current summation unit 103 outputs a combined current signal of phase a to a corresponding terminal of the current input interface of the standard meter 300 by terminals Ia$^+$ and Ia$^-$, outputs a combined current signal of phase b to a corresponding terminal of the current input interface of the standard meter 300 by terminals Ib$^+$ and Ib$^-$, and outputs a combined current signal of phase c to a corresponding terminal of the current input interface of the standard meter 300 by terminals Ic$^+$ and Ic$^-$.

The standard meter 300 determines a standard electric energy value based on the received voltage test signal and combined current signal, and outputs the standard electric energy value to the calculation control unit 104 by a signal line of electric energy pulse 3. The calculation control unit 104 calibrates the dynamic error of the dynamic error measurement apparatus 100 for an electricity meter based on the standard electric energy value and the total electric energy value.

As a preferred implementation, the steady-state accuracy of the standard meter 300 is two classes higher than the dynamic accuracy of the dynamic error measurement apparatus 100 for an electricity meter.

As an optional implementation, the dynamic error of the dynamic error measurement apparatus 100 for an electricity meter may be calibrated by an error arithmetic unit of the standard meter. When the error arithmetic unit of the standard meter is used, the calculation control unit 104 no longer calibrates the dynamic error of the dynamic error measurement apparatus 100 for an electricity meter, but outputs the total electric energy value to the error arithmetic unit of the standard meter, and the standard meter no longer outputs the standard electric energy value to the calculation control unit 104 (in the standard meter, the standard electric energy value is necessarily output to the error arithmetic unit of the standard meter). The error arithmetic unit of the standard meter compares the total electric energy value and the standard electric energy value to calibrate the dynamic error of the dynamic error measurement apparatus 100 for an electricity meter.

Figure 4:
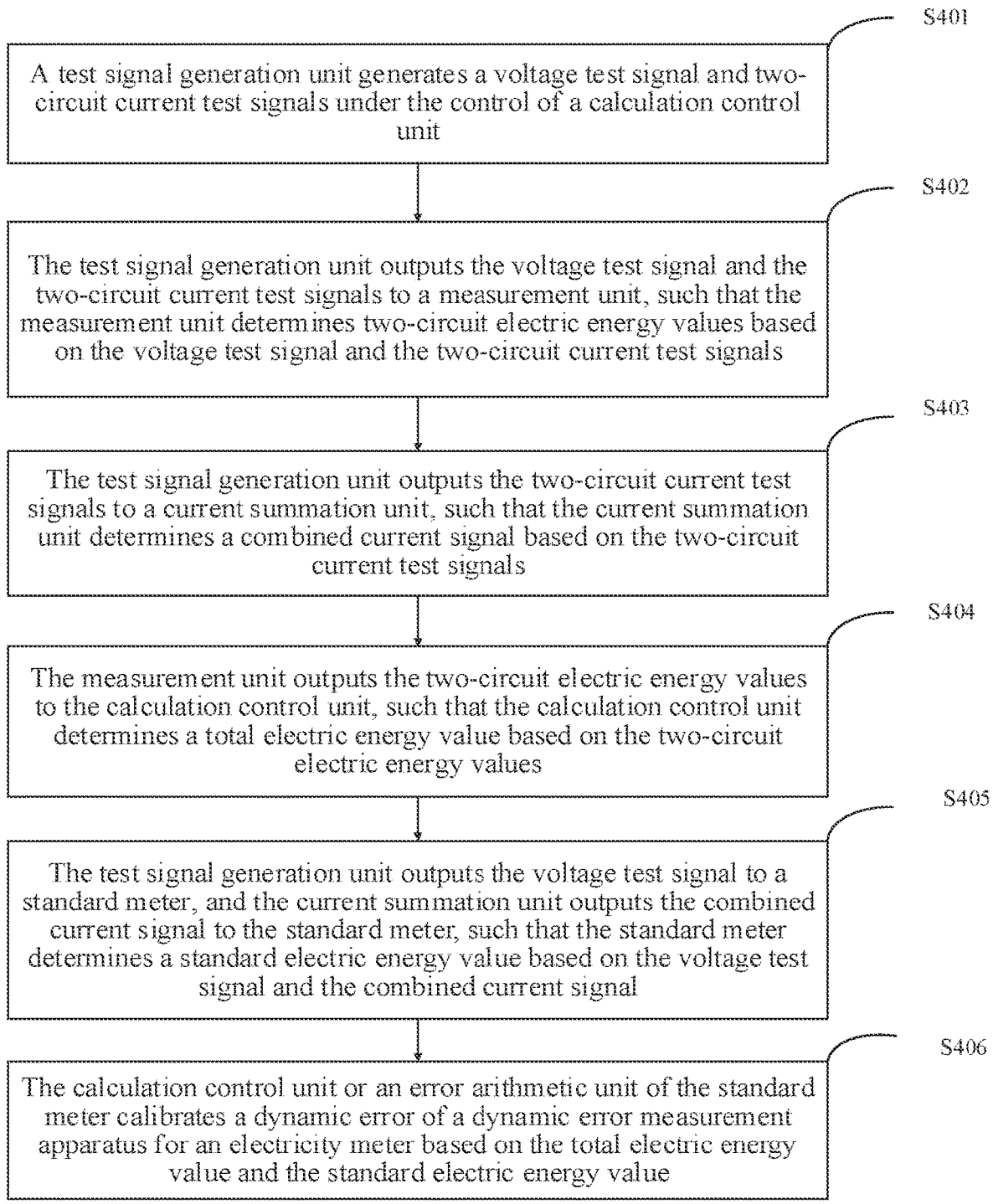
FIG. 4 is a schematic flowchart of a dynamic error calibration method for a dynamic error measurement apparatus for an electricity meter according to an embodiment of the present disclosure.

FIG. 4 is a schematic flowchart of a dynamic error calibration method for a dynamic error measurement apparatus for an electricity meter according to an embodiment of the present disclosure. The dynamic error calibration method is implemented by the dynamic error measurement system for an electricity meter in FIG. 3. The method includes the following steps:

Step S401: The test signal generation unit generates a voltage test signal and two-circuit current test signals under the control of the calculation control unit.

Step S402: The test signal generation unit outputs the voltage test signal and the two-circuit current test signals to the measurement unit, such that the measurement unit determines two-circuit electric energy values based on the voltage test signal and the two-circuit current test signals.

Step S403: The test signal generation unit outputs the two-circuit current test signals to the current summation unit, such that the current summation unit determines a combined current signal based on the two-circuit current test signals.

Step S404: The measurement unit outputs the two-circuit electric energy values to the calculation control unit, such that the calculation control unit determines a total electric energy value based on the two-circuit electric energy values.

Step S405: The test signal generation unit outputs the voltage test signal to the standard meter, and the current summation unit outputs the combined current signal to the standard meter, such that the standard meter determines a standard electric energy value based on the voltage test signal and the combined current signal.

Step S406: The calculation control unit or the error arithmetic unit of the standard meter calibrates a dynamic error of the dynamic error measurement apparatus for an electricity meter based on the total electric energy value and the standard electric energy value.

As an optional implementation, a first-circuit current test signal and a second-circuit current test signal in the two-circuit current test signals form a mirror change pair, the mirror change pair takes a power-frequency steady-state signal as a reference signal, waveforms of the first-circuit current test signal and the second-circuit current test signal are constantly changing relative to the reference signal, and a ratio of a sum of instantaneous values of the first-circuit current test signal and the second-circuit current test signal at any time to an instantaneous value of the reference signal at that time does not change. The power-frequency steady-state signal is a power-frequency sine wave signal whose amplitude, frequency and phase remain unchanged, or a power-frequency steady-state distorted signal. The power-frequency steady-state distorted signal contains a power-frequency fundamental wave signal and its finite harmonic signal.

The following uses an example in which the dynamic error measurement apparatus for an electricity meter is a three-phase measurement apparatus, to describe in detail the signals generated by the test signal generation unit.

The following formulas (1), (2) and (3) are mathematical expressions of a voltage test signal $u_a(t)$ of phase a, a first-circuit current test signal $i_a1(t)$ of phase a, and a second-circuit current test signal $i_a2(t)$ of phase a respectively; and the following formulas (4), (5) and (6) are mathematical expressions of a voltage test signal $u_b(t)$ of phase b, a first-circuit current test signal $i_b1(t)$ of phase b, and a second-circuit current test signal $i_b2(t)$ of phase b respectively; and the following formulas (7), (8) and (9) are mathematical expressions of a voltage test signal $u_c(t)$ of phase c, a first-circuit current test signal $i_c1(t)$ of phase c, and a second-circuit current test signal $i_c2(t)$ of phase c respectively.

$$u_a(t) = 57.7 \cdot \sqrt{2} \cdot \sin(2\pi \cdot 50 \cdot t + 0) \tag{1}$$

$$i_a1(t) = \sqrt{2} \cdot [0.5 + 0.25 \cdot \sin(2\pi \cdot 5 \cdot t + 0)] \cdot \sin(2\pi \cdot 50 \cdot t + 0) \tag{2}$$

$$i_a2(t) = \sqrt{2} \cdot [0.5 - 0.25 \cdot \sin(2\pi \cdot 5 \cdot t + 0)] \cdot \sin(2\pi \cdot 50 \cdot t + 0) \tag{3}$$

$$u_b(t) = 57.7 \cdot \sqrt{2} \cdot \sin\left(2\pi \cdot 50 \cdot t - \frac{2\pi}{3}\right) \tag{4}$$

$$i_b1(t) = \sqrt{2} \cdot \left[0.5 + 0.25 \cdot \sin\left(2\pi \cdot 5 \cdot t - \frac{2\pi}{30}\right)\right] \cdot \sin\left(2\pi \cdot 50 \cdot t - \frac{2\pi}{3}\right) \tag{5}$$

$$i_b2(t) = \sqrt{2} \cdot \left[0.5 - 0.25 \cdot \sin\left(2\pi \cdot 5 \cdot t - \frac{2\pi}{30}\right)\right] \cdot \sin\left(2\pi \cdot 50 \cdot t - \frac{2\pi}{3}\right) \tag{6}$$

$$u_c(t) = 57.7 \cdot \sqrt{2} \cdot \sin\left(2\pi \cdot 50 \cdot t + \frac{2\pi}{3}\right) \tag{7}$$

$$i_c1(t) = \sqrt{2} \cdot \left[0.5 + 0.25 \cdot \sin\left(2\pi \cdot 5 \cdot t + \frac{2\pi}{30}\right)\right] \cdot \sin\left(2\pi \cdot 50 \cdot t + \frac{2\pi}{3}\right), \tag{8}$$

$$\text{and } i_c2(t) = \sqrt{2} \cdot \left[0.5 - 0.25 \cdot \sin\left(2\pi \cdot 5 \cdot t + \frac{2\pi}{30}\right)\right] \cdot \sin\left(2\pi \cdot 50 \cdot t + \frac{2\pi}{3}\right) \tag{9}$$

The secondary circuit current test signals of phase a are taken as an example to describe a mirror change requirement met by the secondary circuit current test signals of phase a. $i_a1(t)$, namely, the first-circuit current test signal of phase a, and $i_a2(t)$, namely, the second-circuit current test signal of phase a, constitute a mirror change pair of phase a. The secondary circuit current test signals take a power-frequency steady-state signal $\sqrt{2} \cdot 0.5 \cdot \sin(2\pi \cdot 50 \cdot t + 0)$ as a reference signal. Therefore, the two-circuit current test signals have the following characteristics:

1. It can be seen from formulas (2) and (3) that the two-circuit current test signals are actually two modulated signals obtained after the reference signal is amplitude-modulated by two amplitude modulation functions $0.25 \cdot \sin(2\pi \cdot 5 \cdot t + 0)$ and $-0.25 \cdot \sin(2\pi \cdot 5 \cdot t + 0)$ separately. Therefore, waveforms of the two-circuit current test signals are constantly changing relative to a waveform of the reference signal.
2. Since $i_a1(t) + i_a2(t) = \sqrt{2} \cdot \sin(2\pi \cdot 50 \cdot t + 0)$, a ratio of a sum of instantaneous values of the two-circuit current test signals at any time to an instantaneous value of the reference signal $\sqrt{2} \cdot 0.5 \cdot \sin(2\pi \cdot 50 \cdot t + 0)$ at that time remains unchanged and is always 2.

Figure 5:
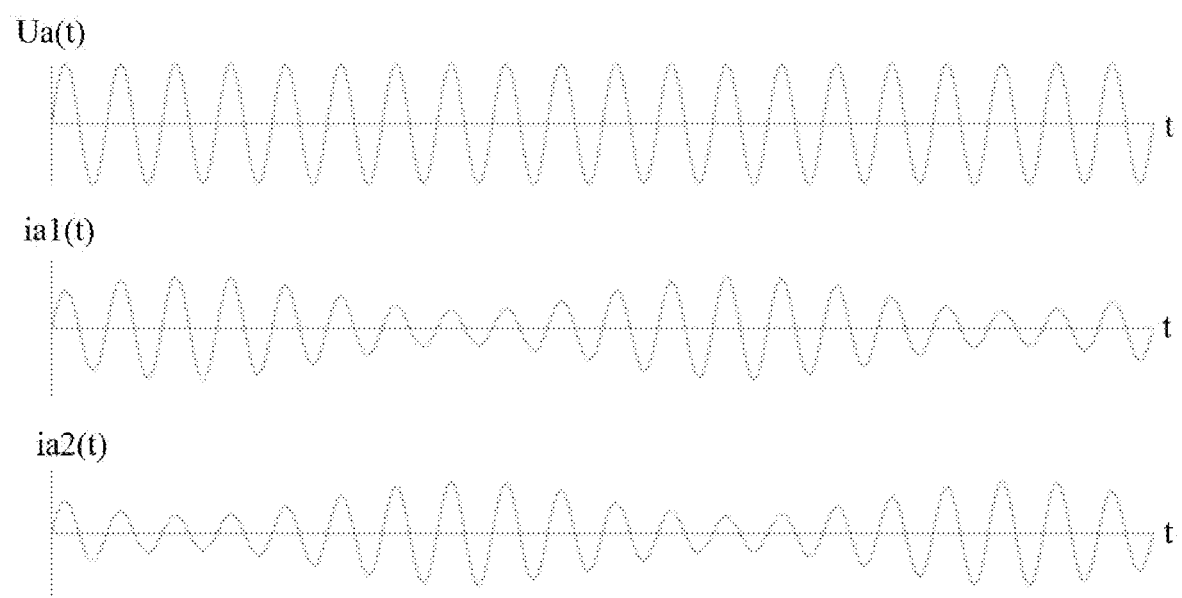
FIG. 5 shows waveform graphs of a phase voltage test signal, a first-circuit current test signal, and a second-circuit current test signal of phase a when a dynamic error of a dynamic error measurement apparatus for an electricity meter is calibrated according to an embodiment of the present disclosure.

FIG. 5 shows waveform graphs of a voltage test signal, a first-circuit current test signal, and a second-circuit current test signal of phase a when a dynamic error of a dynamic error measurement apparatus for an electricity meter is calibrated. A corresponding waveform graph of phase b is the same as that of phase a except that the difference between their initial phases is $-120°$; and a corresponding waveform graph of phase c is the same as that of phase a except that the difference between their initial phases is $120°$. Mirror change requirements met by the current test signals of phase b and phase c are similar to the mirror change requirement met by the current test signals of phase a. Details are not described herein again.

When the dynamic error measurement system for an electricity meter is used to calibrate the dynamic error of the measurement apparatus, a conventional electricity meter that only guarantees a steady-state index can be used as the standard meter, which resolves the current problem of lacking a standard meter with high dynamic accuracy. The standard electric energy value measured by the standard meter and the total electric energy value determined by the measurement apparatus are theoretically equal in any time period, such that it theoretically takes shortest time to calibrate the dynamic error.

Figure 6:
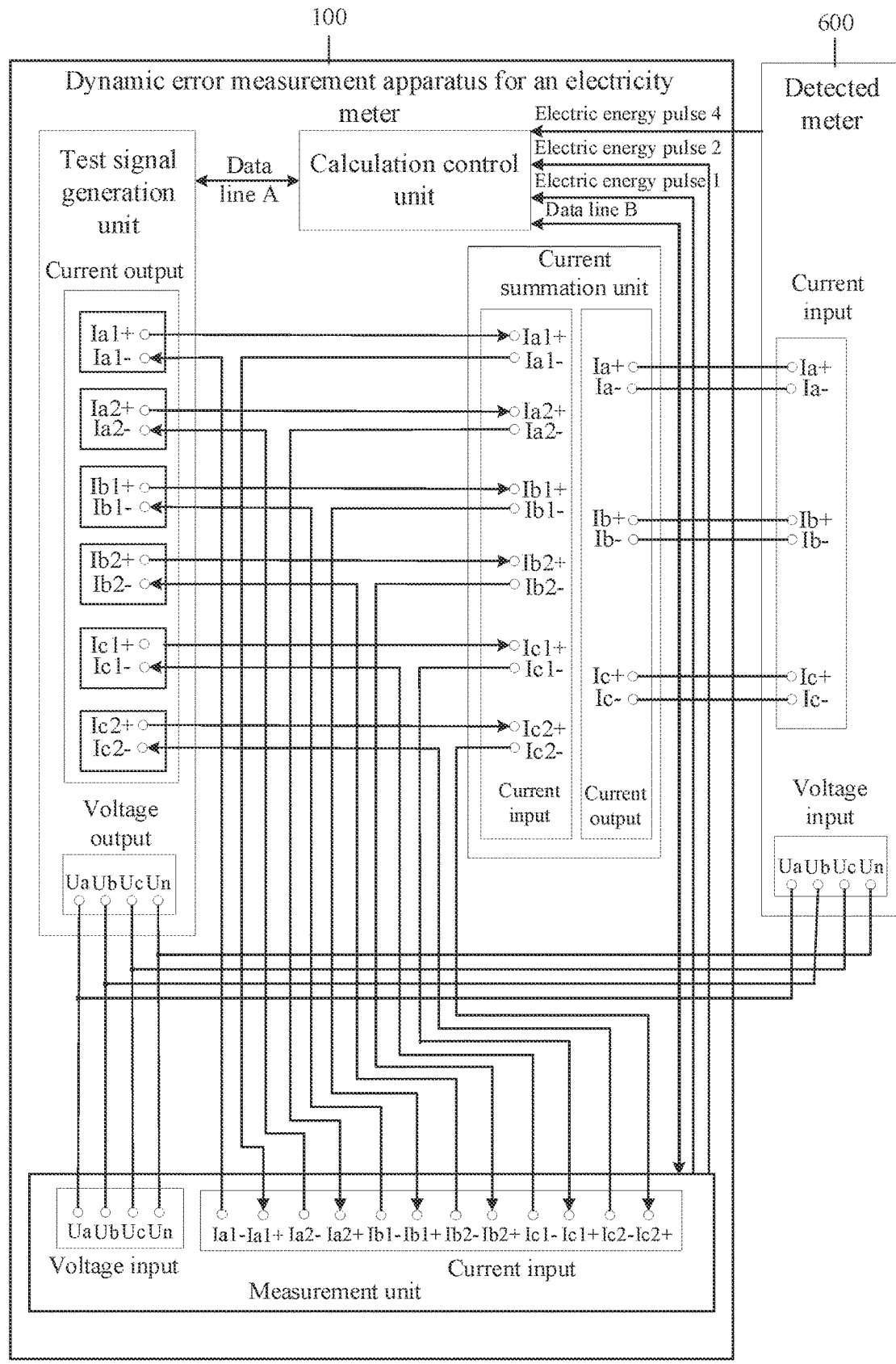
FIG. 6 is a schematic structural diagram of a dynamic error measurement system for an electricity meter according to another embodiment of the present disclosure.

FIG. 6 shows a dynamic error measurement system for an electricity meter according to another embodiment of the present disclosure. The system can be configured to implement a method for testing a dynamic error of a detected meter based on a dynamic error measurement apparatus for an electricity meter, and includes a detected meter 600 and the above-mentioned dynamic error measurement apparatus 100 for an electricity meter. The detected meter 600 is configured to receive a voltage test signal and a combined current signal that are output by the dynamic error measurement apparatus 100 for an electricity meter, and determine a to-be-detected electric energy value based on the voltage test signal and the combined current signal. The calculation control unit 104 of the dynamic error measurement apparatus 100 for an electricity meter is further configured to determine a dynamic error of the detected meter 600 based on the to-be-detected electric energy value and a total electric energy value.

In this system, the voltage test signal generated by the test signal generation unit 101 is output to a corresponding terminal of a voltage input interface of the detected meter 600 in addition to the measurement unit 102. A current test signal output by the current summation unit 103 is output to a corresponding terminal of a current input interface of the detected meter 600.

When the dynamic error measurement apparatus 100 for an electricity meter is a three-phase measurement apparatus, four terminals Ua, Ub, Uc, and Un of a voltage output interface of the test signal generation unit 101 output voltage test signals of phase a, phase b, phase c, and a neutral point respectively, and the voltage test signals are connected to corresponding terminals of the voltage input interface of the detected meter 600 in parallel. The current summation unit 103 outputs a combined current signal of phase a to a corresponding terminal of the current input interface of the detected meter 600 by terminals Ia⁺ and Ia⁻, outputs a combined current signal of phase b to a corresponding terminal of the current input interface of the detected meter 600 by terminals Ib⁺ and Ib⁻, and outputs a combined current signal of phase c to a corresponding terminal of the current input interface of detected meter 600 by terminals Ic+ and Ic−.

The detected meter 600 determines the to-be-detected electric energy value based on the received voltage test signal and combined current signal, and outputs the to-be-detected electric energy value to the calculation control unit 104 by a signal line of electric energy pulse 4. The calculation control unit 104 determines the dynamic error of the detected meter based on the to-be-detected electric energy value and a total electric energy value.

Figure 7:
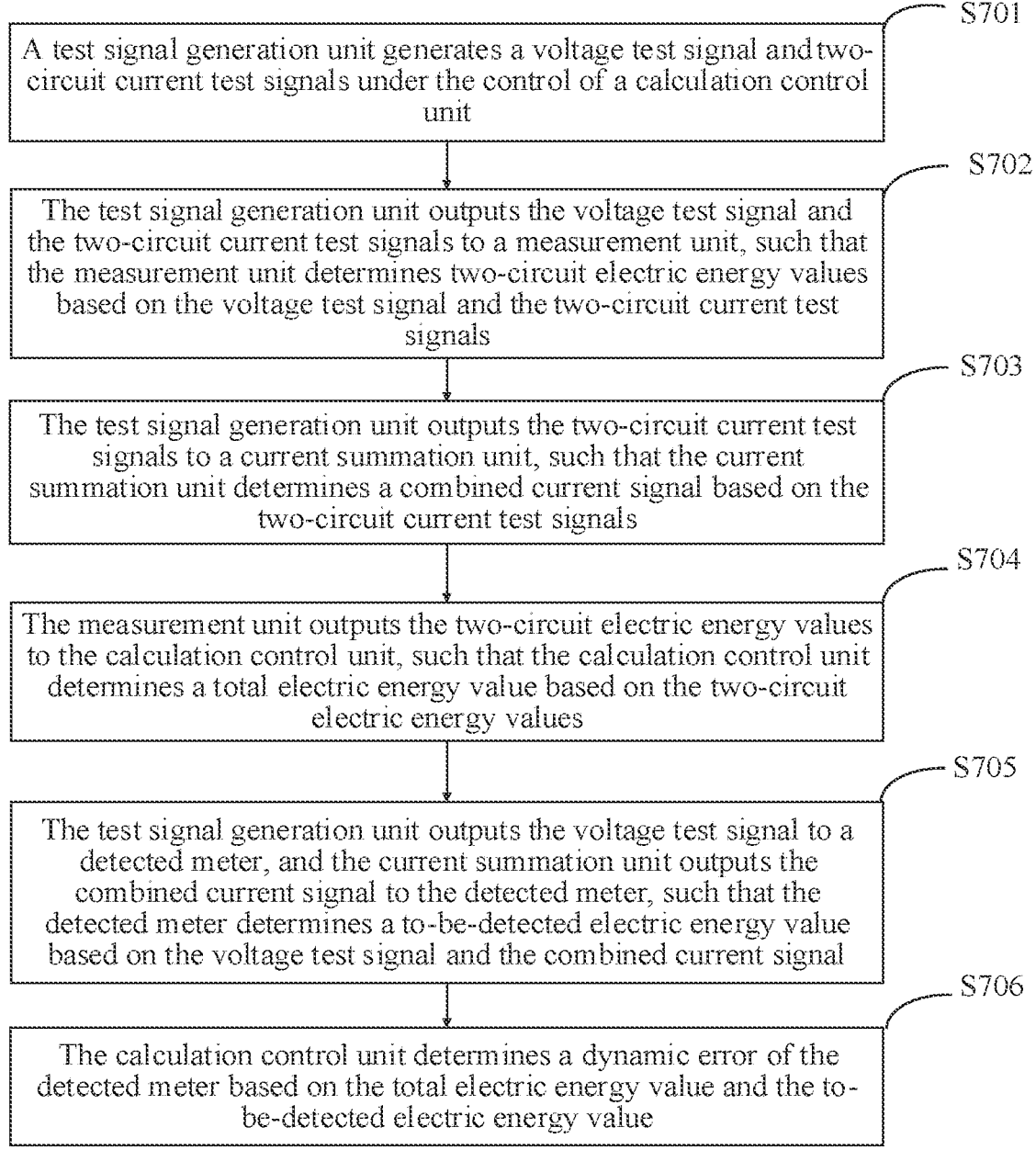
FIG. 7 is a schematic flowchart of a method for testing a dynamic error of a detected meter based on a dynamic error measurement apparatus for an electricity meter according to an embodiment of the present disclosure.

FIG. 7 is a schematic flowchart of a method for testing a dynamic error of a detected meter based on a dynamic error measurement apparatus for an electricity meter according to another embodiment of the present disclosure. The dynamic error testing method is implemented by the dynamic error measurement system for an electricity meter in FIG. 6. The method includes the following steps:

Step S701: The test signal generation unit generates a voltage test signal and two-circuit current test signals under the control of the calculation control unit.

Step S702: The test signal generation unit outputs the voltage test signal and the two-circuit current test signals to the measurement unit, such that the measurement unit determines two-circuit electric energy values based on the voltage test signal and the two-circuit current test signals.

Step S703: The test signal generation unit outputs the two-circuit current test signals to the current summation unit, such that the current summation unit determines a combined current signal based on the two-circuit current test signals.

Step S704: The measurement unit outputs the two-circuit electric energy values to the calculation control unit, such that the calculation control unit determines a total electric energy value based on the two-circuit electric energy values.

Step S705: The test signal generation unit outputs the voltage test signal to the detected meter, and the current summation unit outputs the combined current signal to the detected meter, such that the detected meter determines a to-be-detected electric energy value based on the voltage test signal and the combined current signal.

Step S706: The calculation control unit determines a dynamic error of the detected meter based on the total electric energy value and the to-be-detected electric energy value.

As an optional implementation, a first-circuit current test signal and a second-circuit current test signal in the two-circuit current test signals form an in-phase change pair and are both power frequency signals, valid values of power frequencies of the first-circuit current test signal and the second-circuit current test signal are constantly changing with time, and waveforms are always consistent.

The following uses an example in which the dynamic error measurement apparatus for an electricity meter is a three-phase measurement apparatus, to describe in detail the signals generated by the test signal generation unit.

The following formulas (10), (11) and (12) are mathematical expressions of a voltage test signal $u_a(t)$ of phase a, a first-circuit current test signal $i_a1(t)$ of phase a, and a second-circuit current test signal $i_a2(t)$ of phase a respectively; the following formulas (13), (14) and (15) are mathematical expressions of a voltage test signal $u_b(t)$ of phase b, a first-circuit current test signal $i_b1(t)$ of phase b, and a second-circuit current test signal $i_b2(t)$ of phase b respectively; and the following formulas (16), (17) and (18) are mathematical expressions of a voltage test signal $u_c(t)$ of phase c, a first-circuit current test signal $i_c1(t)$ of phase c, and a second-circuit current test signal $i_c2(t)$ of phase c respectively.

$$u_a(t) = 57.7 \cdot \sqrt{2} \cdot \sin(2\pi \cdot 50 \cdot t + 0) \tag{10}$$

$$i_a1(t) = \sqrt{2} \cdot [0.5 + 0.25 \cdot \sin(2\pi \cdot 5 \cdot t + 0)] \cdot \sin(2\pi \cdot 50 \cdot t + 0) \tag{11}$$

$$i_a2(t) = \sqrt{2} \cdot [0.5 + 0.25 \cdot \sin(2\pi \cdot 5 \cdot t + 0)] \cdot \sin(2\pi \cdot 50 \cdot t + 0) \tag{12}$$

$$u_b(t) = 57.7 \cdot \sqrt{2} \cdot \sin\left(2\pi \cdot 50 \cdot t - \frac{2\pi}{3}\right) \tag{13}$$

$$i_b1(t) = \sqrt{2} \cdot \left[0.5 + 0.25 \cdot \sin\left(2\pi \cdot 5 \cdot t - \frac{2\pi}{30}\right)\right] \cdot \sin\left(2\pi \cdot 50 \cdot t - \frac{2\pi}{3}\right) \tag{14}$$

$$i_b2(t) = \sqrt{2} \cdot \left[0.5 + 0.25 \cdot \sin\left(2\pi \cdot 5 \cdot t - \frac{2\pi}{30}\right)\right] \cdot \sin\left(2\pi \cdot 50 \cdot t - \frac{2\pi}{3}\right) \tag{15}$$

$$u_c(t) = 57.7 \cdot \sqrt{2} \cdot \sin\left(2\pi \cdot 50 \cdot t + \frac{2\pi}{3}\right) \tag{16}$$

$$i_c1(t) = \sqrt{2} \cdot \left[0.5 + 0.25 \cdot \sin\left(2\pi \cdot 5 \cdot t + \frac{2\pi}{30}\right)\right] \cdot \sin\left(2\pi \cdot 50 \cdot t + \frac{2\pi}{3}\right), \tag{17}$$

$$\text{and } i_c2(t) = \sqrt{2} \cdot \left[0.5 + 0.25 \cdot \sin\left(2\pi \cdot 5 \cdot t + \frac{2\pi}{30}\right)\right] \cdot \sin\left(2\pi \cdot 50 \cdot t + \frac{2\pi}{3}\right) \tag{18}$$

The two-circuit current test signals of phase a are taken as an example to describe an in-phase change requirement met by the two-circuit current test signals of phase a.$i_a1(t)$, namely, the first-circuit current test signal of phase a, and $i_a2(t)$, namely, the second-circuit current test signal of phase a, constitute an in-phase change pair of phase a. It can be seen from formulas (11) and (12) that the two-circuit current test signals are actually a same signal, which is a modulated signal obtained by performing amplitude modulation on a power-frequency carrier signal √2·0.5·sin(2π·50·t+0) with a frequency of 50 Hz by an amplitude modulation function 0.25·sin(2π·5·t+0). Therefore, the two-circuit current test signals are power frequency signals, and valid values of their power frequencies are constantly changing with time, and waveforms of the two-circuit current test signals are always consistent.

Since formula (10) is the same as formula (1), formula (11) and formula (12) are the same as formula (2), and waveform graphs corresponding to formula (1) and formula (2) have been shown in FIG. 5, the corresponding waveform graphs are not illustrated repeatedly. A corresponding waveform graph of phase b is the same as that of phase a except that the difference between their initial phases is −120°; and a corresponding waveform graph of phase c is the same as that of phase a except that the difference between their initial phases is 120°. In-phase change requirements met by the current test signals of phase b and phase c are similar to the in-phase change requirement met by the current test signals of phase a. Details are not described herein again.

A hardware configuration and a wiring mode for testing the dynamic error of the detected meter by the above-mentioned dynamic error measurement system for an electricity meter are the same as those for calibrating the dynamic error of the dynamic error measurement system for an electricity meter, which can greatly reduce uncertainty factors affecting a result.

It should also be noted that the term "comprise", "include", or any other variant thereof is intended to encompass a non-exclusive inclusion, such that a process, method, product, or device that includes a series of elements includes not only those elements, but also other elements not explicitly listed, or elements that are inherent to such a process, method, product, or device. Without more restrictions, an element defined by the phrase "including a . . . " does not exclude the presence of another same element in a process, method, product, or device that includes the element.

Those skilled in the art should understand that the embodiments of the present disclosure may be provided as a method, a system, or a computer program product. Therefore, the present disclosure may use a form of hardware-only embodiments, software-only embodiments, or embodiments with a combination of software and hardware. Moreover, the present disclosure may be in a form of a computer program product that is implemented on one or more computer-usable storage media (including but not limited to a magnetic disk memory, a CD-ROM, an optical memory, and the like) that include computer-usable program code.

The above described are merely preferred embodiments of the present disclosure, which are not intended to limit the present disclosure. Various changes and modifications can be made to the present disclosure by those skilled in the art. Any modifications, equivalent replacements, improvements, etc., made within the spirit and principle of the present disclosure should be included within the protection scope of the claims of the present disclosure.

The invention claimed is:

1. A dynamic error measurement apparatus for an electricity meter, comprising a test signal generation unit, a measurement unit, a current summation unit, and a calculation control unit, wherein
the test signal generation unit is configured to generate a voltage test signal and two-circuit current test signals under the control of the calculation control unit, output the voltage test signal to the measurement unit, and output the two-circuit current test signals to the current summation unit and the measurement unit;
the measurement unit is configured to determine two-circuit electric energy values based on the received voltage test signal and the received two-circuit current test signals, and output the two-circuit electric energy values to the calculation control unit;
the current summation unit is configured to determine a combined current signal based on the two-circuit current test signals; and
the calculation control unit is configured to determine a total electric energy value based on the two-circuit electric energy values.

2. The dynamic error measurement apparatus for an electricity meter according to claim 1, wherein the test signal generation unit is configured to generate a single-phase voltage test signal and two-circuit single-phase current test signals under the control of the calculation control unit, output the single-phase voltage test signal to the measurement unit, and output the two-circuit single-phase current test signals to the current summation unit and the measurement unit;
the measurement unit is configured to determine two-circuit single-phase electric energy values based on the received single-phase voltage test signal and the received two-circuit single-phase current test signals, and output the two-circuit single-phase electric energy values to the calculation control unit;
the current summation unit is configured to determine a single-phase combined current signal based on the two-circuit single-phase current test signals; and
the calculation control unit is configured to determine a total single-phase electric energy value based on the two-circuit single-phase electric energy values.

3. The dynamic error measurement apparatus for an electricity meter according to claim 1, wherein the test signal generation unit is configured to generate a three-phase voltage test signal and two-circuit three-phase current test signals under the control of the calculation control unit, output the three-phase voltage test signal to the measurement unit, and output the two-circuit three-phase current test signals to the current summation unit and the measurement unit;
the measurement unit is configured to determine two-circuit three-phase electric energy values based on the received three-phase voltage test signal and the received two-circuit three-phase current test signals, and output the two-circuit three-phase electric energy values to the calculation control unit;
the current summation unit is configured to determine a three-phase combined current signal based on the two-circuit three-phase current test signals; and
the calculation control unit is configured to determine a total three-phase electric energy value based on the two-circuit three-phase electric energy values.

4. The dynamic error measurement apparatus for an electricity meter according to claim 1, wherein the two-circuit current test signals comprise a first-circuit current test signal and a second-circuit current test signal; and the two-circuit electric energy values comprise a first-circuit electric energy value and a second-circuit electric energy value;
the measurement unit is configured to determine the first-circuit electric energy value based on the voltage test signal and the first-circuit current test signal, determine the second-circuit electric energy value based on the voltage test signal and the second-circuit current test signal, and output the first-circuit electric energy value and the second-circuit electric energy value to the calculation control unit; and
the calculation control unit is configured to determine the total electric energy value based on a sum of the first-circuit electric energy value and the second-circuit electric energy value.

5. A dynamic error calibration system for a dynamic error measurement apparatus for an electricity meter, comprising a standard meter and the dynamic error measurement apparatus for an electricity meter according to claim 1, wherein
the standard meter is configured to receive a voltage test signal and a combined current signal that are output by the dynamic error measurement apparatus for an electricity meter, and determine a standard electric energy value based on the voltage test signal and the combined current signal, wherein steady-state accuracy of the standard meter is higher than dynamic accuracy of the dynamic error measurement apparatus for an electricity meter; and
the calculation control unit or an error arithmetic unit of the standard meter is further configured to calibrate a dynamic error of the dynamic error measurement apparatus for an electricity meter based on the standard electric energy value and a total electric energy value.

6. A dynamic error calibration method for a dynamic error measurement apparatus for an electricity meter, implemented by the dynamic error calibration system for a dynamic error measurement apparatus for an electricity meter according to claim 5, wherein the method comprises:
generating, by the test signal generation unit, a voltage test signal and two-circuit current test signals under the control of the calculation control unit;

outputting, by the test signal generation unit, the voltage test signal and the two-circuit current test signals to the measurement unit, such that the measurement unit determines two-circuit electric energy values based on the voltage test signal and the two-circuit current test signals;

outputting, by the test signal generation unit, the two-circuit current test signals to the current summation unit, such that the current summation unit determines a combined current signal based on the two-circuit current test signals;

outputting, by the measurement unit, the two-circuit electric energy values to the calculation control unit, such that the calculation control unit determines a total electric energy value based on the two-circuit electric energy values;

outputting, by the test signal generation unit, the voltage test signal to the standard meter, and outputting, by the current summation unit, the combined current signal to the standard meter, such that the standard meter determines a standard electric energy value based on the voltage test signal and the combined current signal; and calibrating, by the calculation control unit or the error arithmetic unit of the standard meter, a dynamic error of the dynamic error measurement apparatus for an electricity meter based on the total electric energy value and the standard electric energy value.

7. The dynamic error calibration method for a dynamic error measurement apparatus for an electricity meter according to claim 6, wherein a first-circuit current test signal and a second-circuit current test signal in the two-circuit current test signals form a mirror change pair, the mirror change pair takes a power-frequency steady-state signal as a reference signal, waveforms of the first-circuit current test signal and the second-circuit current test signal are constantly changing relative to the reference signal, and a ratio of a sum of instantaneous values of the first-circuit current test signal and the second-circuit current test signal at any time to an instantaneous value of the reference signal at that time does not change.

8. A dynamic error measurement system for an electricity meter, comprising a detected meter and the dynamic error measurement apparatus for an electricity meter according to claim 1, wherein the detected meter is configured to receive a voltage test signal and a combined current signal that are output by the dynamic error measurement apparatus for an electricity meter, and determine a to-be-detected electric energy value based on the voltage test signal and the combined current signal; and the calculation control unit is further configured to determine a dynamic error of the detected meter based on the to-be-detected electric energy value and a total electric energy value.

9. A method for testing a dynamic error of a detected meter based on a dynamic error measurement apparatus for an electricity meter, implemented by the dynamic error measurement system for an electricity meter according to claim 8, wherein the method comprises:

generating, by the test signal generation unit, a voltage test signal and two-circuit current test signals under the control of the calculation control unit;

outputting, by the test signal generation unit, the voltage test signal and the two-circuit current test signals to the measurement unit, such that the measurement unit determines two-circuit electric energy values based on the voltage test signal and the two-circuit current test signals;

outputting, by the test signal generation unit, the two-circuit current test signals to the current summation unit, such that the current summation unit determines a combined current signal based on the two-circuit current test signals;

outputting, by the measurement unit, the two-circuit electric energy values to the calculation control unit, such that the calculation control unit determines a total electric energy value based on the two-circuit electric energy values;

outputting, by the test signal generation unit, the voltage test signal to the detected meter, and outputting, by the current summation unit, the combined current signal to the detected meter, such that the detected meter determines a to-be-detected electric energy value based on the voltage test signal and the combined current signal; and determining, by the calculation control unit, a dynamic error of the detected meter based on the total electric energy value and the to-be-detected electric energy value.

10. The method for testing a dynamic error of a detected meter based on a dynamic error measurement apparatus for an electricity meter according to claim 9, wherein a first-circuit current test signal and a second-circuit current test signal in the two-circuit current test signals form an in-phase change pair and are both power frequency signals, valid values of power frequencies of the first-circuit current test signal and the second-circuit current test signal are constantly changing with time, and waveforms are always consistent.

* * * * *